United States Patent
Nishizawa et al.

(10) Patent No.: US 9,083,307 B2
(45) Date of Patent: Jul. 14, 2015

(54) FLEXURAL VIBRATOR ELEMENT, ELECTRONIC DEVICE, AND METHOD OF MANUFACTURING FLEXURAL VIBRATOR ELEMENT

(75) Inventors: Ryuta Nishizawa, Matsumoto (JP); Seiichiro Ogura, Minowa (JP); Takayuki Kikuchi, Okaya (JP)

(73) Assignee: Seiko Epson Corporation (JP)

( * ) Notice: Subject to any disclaimer, the term of this patent is extended or adjusted under 35 U.S.C. 154(b) by 405 days.

(21) Appl. No.: 13/530,615

(22) Filed: Jun. 22, 2012

(65) Prior Publication Data
US 2012/0326570 A1 Dec. 27, 2012

(30) Foreign Application Priority Data
Jun. 24, 2011 (JP) ................................. 2011-140618

(51) Int. Cl.
H03H 9/21 (2006.01)
H03H 9/215 (2006.01)
H03H 3/02 (2006.01)

(52) U.S. Cl.
CPC .............. *H03H 9/215* (2013.01); *H03H 3/02* (2013.01); *H03H 2003/026* (2013.01)

(58) Field of Classification Search
CPC ... H03H 9/21; H03H 9/215; H03H 2003/026; H03H 9/2468; B06B 1/0659
USPC ............................ 310/370; 333/200; 331/156
See application file for complete search history.

(56) References Cited

U.S. PATENT DOCUMENTS

| | | | |
|---|---|---|---|
| 5,668,317 A | 9/1997 | Farine et al. | |
| 6,806,797 B2 | 10/2004 | Kikushima | |
| 6,898,832 B2 | 5/2005 | Kawashima | |
| 7,412,886 B2 * | 8/2008 | Dalla Piazza et al. | 73/504.16 |
| 8,373,333 B2 * | 2/2013 | Yamada | 310/368 |
| 8,633,637 B2 * | 1/2014 | Nishizawa | 310/370 |
| 8,766,515 B2 * | 7/2014 | Furuhata et al. | 310/370 |
| 2003/0080652 A1 * | 5/2003 | Kawashima | 310/370 |
| 2004/0085163 A1 | 5/2004 | Kikushima | |
| 2011/0140575 A1 | 6/2011 | Nishizawa | |

FOREIGN PATENT DOCUMENTS

| | | |
|---|---|---|
| CN | 102098022 A | 6/2011 |
| JP | 08-018371 | 1/1996 |
| JP | 08-162874 | 6/1996 |
| JP | 09-014973 | 1/1997 |
| JP | 10-089971 | 4/1998 |

(Continued)

*Primary Examiner* — J. San Martin
(74) *Attorney, Agent, or Firm* — Harness, Dickey & Pierce, P.L.C.

(57) ABSTRACT

A flexural vibrator element has a vibrator arm extending from a base section and having a rectangular cross-sectional shape, the vibrator arm having first and second step sections composed of step surfaces intersecting respectively with a left side surface and a right side surface, and step side surfaces intersecting respectively with an upper surface and a lower surface, between the lower surface, the upper surface and the left side surface, the right side surface, and first and fourth detection electrodes on the left and right side surfaces and second and third detection electrodes on the step side surfaces are respectively separated in a thickness direction of the vibrator arm. The first through fourth detection electrodes are patterned with accuracy by exposure from the upper surface and the lower surface using a common exposure device by existing photo etching.

8 Claims, 12 Drawing Sheets

(56) References Cited

FOREIGN PATENT DOCUMENTS

| | | |
|---|---|---|
| JP | 10-239066 | 9/1998 |
| JP | 2002-340559 | 11/2002 |
| JP | 2004-007428 | 1/2004 |
| JP | 2004-125458 | 4/2004 |
| JP | 2006-177945 | 7/2006 |
| JP | 2006-262289 | 9/2006 |
| JP | 2007-093400 | 4/2007 |
| JP | 4010218 | 9/2007 |
| JP | 4136754 | 6/2008 |
| JP | 2008-256542 | 10/2008 |
| JP | 2009-189039 | 8/2009 |

* cited by examiner

FLEXURAL VIBRATOR ELEMENT, ELECTRONIC DEVICE, AND METHOD OF MANUFACTURING FLEXURAL VIBRATOR ELEMENT

BACKGROUND

1. Technical Field

The present invention relates to a flexural vibrator element, and a method of manufacturing the flexural vibrator element. Further, the invention relates to a variety of electronic devices using the flexural vibrator element.

2. Related Art

In the past, in order for detecting a physical quantity such as an angular velocity, an angular acceleration, an acceleration, or force, a sensor such as a piezoelectric vibrating gyroscope using a flexural vibrator element has been used widely in a variety of electronic devices such as a digital still camera, a video camera, a navigation system, a vehicle posture detection device, a pointing device, a game controller, a cellular phone, and a head-mount display. As the flexural vibrator element for the piezoelectric gyroscope, there has been known a tuning-fork flexural vibrator element provided with a driving vibrator arm and a detecting vibrator arm disposed in parallel to each other (see, e.g., JP-A-9-14973 (Patent Document 1), and JP-A-2002-340559 (Patent Document 2)).

In general, in the tuning-fork flexural vibrator element, when applying an alternating-current voltage to an excitation electrode of the driving vibrator arm, the both vibrator arms make flexural vibration inside the plane of the vibrator element. In this state, if the flexural vibrator element moves rotationally around the extension direction of the vibrator arm, the Coriolis force is caused, and the both vibrator arms make flexural vibration in the direction perpendicular to the plane of the vibrator element. The voltage caused between the detection electrodes of the detecting vibrator arm by the operation described above is detected as an electrical signal corresponding to the angular acceleration of the rotational movement of the flexural vibrator element.

It has been known that it is possible for the detecting vibrator arm to detect the voltage caused by the rotational movement of the flexural vibrator element with high sensitivity by providing the detection electrodes on the right and left side surfaces instead of the upper and lower surfaces thereof (see, e.g., Patent Document 2 and JP-A-2007-93400 (Patent Document 3)). FIGS. 11A through 11C show the typical example of such a tuning-fork flexural vibrator element in the related art. The tuning-fork flexural vibrator element 1 is provided with the driving vibrator arm 3 and the detecting vibrator arm 4 extending from a base section 2 having a rectangular shape in parallel to each other. The driving vibrator arm 3 has drive electrodes 5a through 5d respectively on upper and lower surfaces and right and left side surfaces, and when applying an alternating-current voltage to generate electrical fields between the drive electrodes adjacent to each other in the directions alternately reversed, the both vibrator arms vibrate flexurally in the directions opposite to each other along the X-axis direction. The detecting vibrator arm 4 has two pairs of detection electrodes 6a, 7a, and 6b, 7b disposed respectively on the left and right side surfaces so as to be separated in the thickness direction and have polarities different from each other. In the state in which the both vibrator arms 3, 4 are vibrating flexurally in the X-axis direction, if the flexural vibrator element 1 makes a rotational movement around the Y-axis direction, the both vibrator arms vibrate flexurally in the directions opposite to each other along the Z-axis direction. Since the electrical field caused inside the detecting vibrator arm 4 by the operation described above can efficiently be detected between the respective pairs of detection electrodes 6a and 6b, 7a and 7b opposed to each other on the right and left side surfaces as a voltage with a large amplitude, high sensitivity can be obtained.

In general, the electrodes of the flexural vibrator element are formed by patterning the electrode films by the wet etching using the photolithography technology. FIGS. 12A through 12D exemplify the process of forming the detection electrodes 6a, 6b, 7a, 7b on the side surfaces of the detecting vibrator arm 4 in the flexural vibrator element 1 shown in FIGS. 11A through 11C. Firstly, photo etching is performed on the wafer made of, for example, quartz crystal to process the outer shape of the flexural vibrator element 1 to thereby form an element segment, then an electrode film 8 is made to adhere to the surface thereof, and then a photoresist film 9 is applied to the surface thereof. A photomask 10 is disposed on the upper surface of the element segment using a contact method of making the photomask 10 have direct contact with the upper surface of the element segment (FIG. 12A).

The photomask 10 is provided with opening sections 11a through 11c corresponding to the areas of the photoresist film 9 desired to be exposed. The area 9a corresponding to a roughly entire upper surface of the photoresist film 9 is irradiated with ultraviolet light vertically from above through the opening section 11a, and the areas 9b, 9c of the left and right side surfaces located around the center in the thickness direction are irradiated from obliquely above through the opening sections 11b, 11c, respectively. Subsequently, the photomask 10 is disposed on the lower surface of the element segment similarly using the contact method, and then the area 9d corresponding to a roughly entire lower surface of the photoresist film 9 and the areas 9b, 9c of the left and right side surfaces are similarly exposed.

Subsequently, the photoresist film 9 is developed to thereby remove the areas thus exposed and form resist patterns 12, and thus the electrode film 8 is exposed (FIG. 12B). The part of the electrode film thus exposed is removed by wet etching to thereby expose the quartz crystal surface (FIG. 12C). Finally, by completely removing the residual resist patterns 12, the detection electrodes 6a, 6b, 7a, and 7b separated in the thickness direction are formed on the side surfaces of the detecting vibrator arm 4 (FIG. 12D).

Further, there has been known a method of manufacturing a piezoelectric vibrator element in which the detection electrodes separated in the thickness direction are formed on the side surface of the detecting vibrator arm by using a wafer made of a piezoelectric material having an etching rate higher in the thickness direction than in the width direction (see, e.g., Japanese Patent No. 4,010,218 (Patent Document 4)). In this method, the detection electrodes divided in the thickness direction are formed on the side surfaces of the detecting vibrator arm by processing the piezoelectric vibrator element in the outer shape using wet etching and then making an electrode film adhere thereon so that a projecting strip extending in the longitudinal direction remains in the center of the side surfaces of a vibrating vibrator arm, then exposing the photoresist film formed thereon vertically from above and below simultaneously and then developing it to thereby pattern the photoresist film so that the electrode film is exposed on the upper and lower surfaces of the vibrating vibrator arm and at the tip of the projecting strip, and then etching the part of the electrode film thus exposed.

Further, there has been known a method of etching a quartz crystal plate on the both sides thereof so as to leave a part thereof in the thickness direction to thereby form grooves along the outer shape of the vibrator, then forming electrode films on the side surfaces of the grooves, then mechanically breaking the part of the grooves left in the etching process to thereby separate discrete vibrators, and at the same time forming electrodes separated in the thickness direction by the projection remaining in the grooves at that occasion (see, e.g., JP-A-8-18371 (Patent Document 5)). Further, there has been known a method of removing the part of the grooves, which is left in the etching process, using re-etching to thereby divide the electrode in the thickness direction in a similar manner (see, e.g., JP-A-8-162874 (Patent Document 6)).

As the flexural vibrator element for the piezoelectric vibrating gyroscope, there have been proposed those having various structures besides the tuning-fork type described above. For example, there has been known a so-called H-type, namely a double tuning-fork type, flexural vibrator element provided with a pair of driving vibrator arms extending from the base section in parallel to each other and a pair of detecting vibrator arms extending from the base section in parallel to each other in the opposite direction to that of the driving vibrator arms (see, e.g., Patent Documents 2, 3, and JP-A-2004-125458 (Patent Document 7)). Further, there has been known a multilegged flexural vibrator element provided with three or more vibrator arms extending from the base section in parallel to each other (see, e.g., JP-A-2006-262289 (Patent Document 8)).

Further, there has been known a flexural vibrator element having grooves formed respectively on the upper and lower surfaces of the detecting vibrator arm along the longitudinal direction thereof, and having detection electrodes disposed respectively on the right and left inner side surfaces of each of the grooves, in addition to the detection electrodes disposed respectively on the right and left side surfaces of the detecting vibrator arm as described above (see, e.g., Patent Document 7). Since the distance between the detection electrodes opposed to each other in the lateral direction of the vibrator element is reduced by disposing the detection electrodes as described above, the voltage caused between the opposed electrodes can more efficiently be detected, and thus the sensitivity is further improved.

In the driving vibrator arm of the flexural vibrator element, by forming grooves respectively on the upper and lower surfaces along the longitudinal direction thereof, and disposing the drive electrodes, which are disposed respectively on the upper and lower sides, on the inner surfaces of the grooves, it is possible to generate the electrical field in parallel to the upper and lower surfaces between the drive electrodes on the right and left side surfaces opposed to each other to thereby improve the electrical field efficiency and thus raise the Q value, and thus suppress the CI value to a low level (see, e.g., JP-A-2009-189039 (Patent Document 9)). According to Patent Document 9, the groove in the longitudinal direction of the driving vibrator arm can be formed on the upper surface or the lower surface thereof as a step having a step section (the inside surface of the upper surface or the lower surface) and an intermediate surface section. The drive electrode on the upper surface side and the lower surface side disposed inside the groove is formed continuously on the step section and the intermediate surface section of the step.

However, as described above in relation to FIGS. 12A through 12D, in the method of the related art of irradiating the photoresist film with the ultraviolet light obliquely to thereby perform patterning in order for dividing the detection electrode on the side surface of the detection arm in the thickness direction, the distance between the opening section of the photomask and the exposed area of the photoresist film becomes long, and therefore the diffraction is caused in the exposure light. Therefore, the resolution is low, and pattern accuracy might be degraded. As a result, in the wet etching of the electrode film, the amount of side-etching is apt to increase, and therefore, it is difficult to accurately pattern the detection electrode, and the fraction defective in manufacturing increases. In particular, since it is difficult to form fine electrode patterns, downsizing of the flexural vibrator element is hindered. Further, since the exposure in the contact method is required to be performed on each of the upper and lower surfaces of the flexural vibrator element, the manufacturing process becomes complicated, and the life of the photomask is also shortened. Further, a special exposure device is necessary for performing the oblique irradiation of the exposure light. As a result of these circumstances, there arises a problem of rise in the manufacturing cost.

Further, the method of the related art described in Patent Document 4 using the wafer made of the piezoelectric material having the etching rate higher in the thickness direction than in the width direction is advantageous because the exposure of the photoresist film can be performed vertically and simultaneously on the upper and lower sides of the vibrator arm instead of the contact method, and therefore, the manufacturing process is simpler, and a common exposure device can be used. However, there is a problem that available piezoelectric material and crystalline orientation are limited.

The method of the related art described in Patent Document 5 requires an additional process and a special jig for breaking the part of the groove left in the etching process. Therefore, there is a problem that the operation becomes complicated, and growth in the manufacturing cost is resulted in. Further, in breaking the part left in the etching process, fragments of the quartz crystal adheres to the quartz crystal vibrator to alter the vibration characteristics, or have contact with other adjacent quartz crystal vibrator or the jig to damage the electrode film, and thus occurrence of defective products or degradation of yield might be incurred. Further, since it is not achievable to control the position at which the quartz crystal is broken, the size of the projection remaining on the side surface of the vibrator arm becomes uneven, and therefore, the balance of the vibrator arm is lost to thereby cause unwanted vibrations, and the vibration characteristics might be degraded.

The method of the related art described in Patent Document 6 also requires an additional process for completely removing the part left in the etching process using the re-etching, and therefore, there is a problem that the process similarly becomes complicated to thereby incur the growth in the manufacturing cost. Further, there is a possibility that hollows caused by the over etching are formed on the side surface of the vibrator arm due to the crystalline anisotropy of the quartz crystal when re-etching the part left in the etching process, or the electrode material caused when removing the resist film and the electrode film formed on the part left in the etching process is reattached to the electrode.

SUMMARY

An advantage of some aspects of the invention is to solve at least a part of the problems described above. Specifically, an advantage of some aspects of the invention is to provide a flexural vibrator element allowing accurate formation of the electrodes separated in the thickness direction on the side surface of the vibrator arm using existing photo etching for performing patterning using a common exposure device without being limited to the material to be used and the crystalline orientation thereof. Another advantage of some aspects of the invention is to make it possible to easily meet the requirement of downsizing in the flexural vibrator element having the electrodes separated in the thickness direction on the side surface of the vibrator arm in such a manner. In particular, an advantage of the flexural vibrator element according to some aspects of the invention is to efficiently detect the charge caused in the detecting vibrator arm to thereby make it possible to achieve high sensitivity even when downsized in the case of being applied to the sensor element such as a piezoelectric vibrating gyroscope.

Still another advantage of some aspects of the invention is to provide a method of manufacturing the flexural vibrator element capable of realizing such a flexural vibrator element with ease and at low cost.

Yet another advantage of some aspects of the invention is to provide an electronic device equipped with a device such as a sensor element provided with such a flexural vibrator element, in particular, such a sensor element having high sensitivity to thereby make it possible to achieve a high performance, reduction in manufacturing cost, and downsizing.

An aspect of the invention is directed to a flexural vibrator element including a base section, a vibrator arm extending from the base section and having a polygonal cross-sectional shape having an upper surface, a lower surface, and right and left side surfaces, and a plurality of electrodes respectively provided to the right and left side surfaces of the vibrator arm, wherein the electrode on at least one side surface of the vibrator arm includes a first electrode and a second electrode separated in a thickness direction of the vibrator arm, the plurality of electrodes is disposed so that a direction of an electrical field generated between the first electrode and the electrode on the other side surface of the vibrator arm corresponding to the first electrode and a direction of an electrical field generated between the second electrode and the electrode on the other side surface corresponding to the second electrode are opposite to each other when the vibrator arm vibrates flexurally along a direction perpendicular to the upper and lower surfaces, and the vibrator arm has a step section formed between the one side surface and one of the upper surface and the lower surface, the step section includes a step surface intersecting with the one side surface and a step side surface intersecting with one of the upper surface and the lower surface, the first electrode and the second electrode are separated by a part of the step surface provided with no electrode film, and formed respectively on the one side surface and the step side surface.

According to the relatively simple configuration of thus forming the step section of the vibrator arm, and providing the step surface from which the electrode film is at least partially eliminated, the electrodes separated in the thickness direction of the vibrator arm can easily be formed on the side surface of the vibrator arm. The step surface from which the electrode film is completely or partially eliminated can be patterned with relative ease and accuracy by the exposure using a common exposure device using the existing photo etching.

Further, since the distance between the electrode on the step side surface and the electrode on the side surface corresponding to the electrode becomes smaller than the distance between the right and left side surfaces in the related art, the capacitance between the electrodes becomes larger than in the related art. Therefore, if the flexural vibrator element according to the aspect of the invention is applied to, for example, a sensor element such as a piezoelectric vibrating gyroscope, since the charge generated between the electrodes can efficiently be detected, high sensitivity can be obtained. Further, in the case of applying the vibrator arm according to the aspect of the invention to the driving vibrator arm, a superior flexural vibrator element with preferable mechanoelectric conversion efficiency, a high Q value, and a low CI value can be obtained. Therefore, a high-performance, high-quality, and miniaturizable flexural vibrator element can be realized.

In one embodiment of the invention, the electrode on the other side surface of the vibrator arm includes a third electrode and a fourth electrode separated in a thickness direction of the vibrator arm, the plurality of electrodes is disposed so that a direction of an electrical field generated between the first electrode and the third electrode corresponding to the first electrode and a direction of an electrical field generated between the second electrode and the fourth electrode corresponding to the second electrode are opposite to each other when the vibrator arm vibrates flexurally along a direction perpendicular to the upper and lower surfaces, and the vibrator arm further has a second step section formed between the other side surface and one of the upper surface and the lower surface, the second step section includes a second step surface intersecting with the other side surface and a second step side surface intersecting with one of the upper surface and the lower surface, the third electrode and the fourth electrode are separated by a part of the second step surface provided with no electrode film, and formed respectively on the other side surface and the second step side surface.

By thus providing the step section to both of the right and left side surfaces of the vibrator arm, the vibrator arm can vibrate flexurally in the out-of-plane direction in a balanced manner. Further, the distance between the first electrode and the third electrode corresponding to the first electrode, and the distance between the second electrode and the fourth electrode corresponding to the second electrode become smaller than the distance between the right and left side surfaces in the related art, the capacitance between the electrodes becomes larger than in the related art. Therefore, if the present flexural vibrator element is applied to a sensor element such as a piezoelectric vibrating gyroscope, since the charge caused by the flexural vibration of the vibrator arm can more efficiently be detected, higher sensitivity can be obtained.

In one embodiment of the invention, the vibrator arm has a longitudinal groove dug on one of the upper surface and the lower surface, a fifth electrode formed on one inner side surface of the longitudinal groove, and a sixth electrode formed on the other inner side surface of the longitudinal groove, the fifth electrode and a sixth electrode are separated by a part of a bottom surface of the longitudinal groove, the part being provided with no electrode film, and the plurality of electrodes is disposed so that a direction of an electrical field generated between the fifth electrode and the electrode on the left side surface of the vibrator arm corresponding to the fifth electrode is the same as a direction of an electrical field generated between the sixth electrode and the electrode on the right side surface of the vibrator arm corresponding to the sixth electrode, and is opposite to a direction of an electrical field generated between the electrode on the left side surface and electrode on the right side surface in one of the lower surface side and the upper surface side provided with no longitudinal groove when the vibrator arm vibrates flexurally along a direction perpendicular to the upper and lower surfaces.

By thus adding the electrodes on the inner side surfaces of the longitudinal groove disposed between the right and left side surfaces, all of the distances between the electrodes corresponding to each other can be reduced, and the capacitance between the electrodes becomes larger than in the related art. Therefore, the charge caused by the flexural vibration of the vibrator arm can further efficiently be detected, and thus the highly sensitive sensor element can be obtained.

In one embodiment of the invention, the step section of the vibrator arm is composed of a plurality of steps, and therefore, by selecting the step side surfaces of the plurality of steps to form the electrode, the distance and capacitance with the electrode of the corresponding side surface can be controlled in accordance the use conditions. Further, the cross-sectional shape of the vibrator arm can be designed so that the vibrator arm can vibrate flexurally in a well-balanced manner.

In one embodiment of the invention, the vibrator arm is a detecting vibrator arm adapted to detect the flexural vibration along the direction perpendicular to the upper and lower surfaces as an electrical signal output from the electrode provided to the vibrator arm, and the flexural vibrator element further includes a driving vibrator arm extending from the base section along an extension direction of the detecting vibrator arm, and a plurality of drive electrodes disposed on the driving vibrator arm so as to make the driving vibrator arm vibrate flexurally along a direction parallel to the upper and lower surfaces. Thus, the tuning-fork flexural vibrator element can be obtained.

Another aspect of the invention is directed to a method of manufacturing the flexural vibration element according to the above aspect of the invention, including processing a vibrator element segment having an outer shape of the flexural vibrator element from a wafer, making the electrode film adhere on a surface of the vibrator element segment, and then forming a photoresist film on the electrode film, patterning the photoresist film on the upper surface, the lower surface, and the step surface of the vibrator element segment by exposing the photoresist film from an upper surface side and a lower surface side, removing, by etching, a part of the electrode film exposed by the patterning to thereby form the electrodes separated in the thickness direction of the vibrator arm on the side surface of the vibrator arm, and removing the photoresist film remaining.

As described above, the electrodes separated in the thickness direction can be formed on the side surface of the detecting vibrator arm by performing accurate patterning by the simultaneous exposure from the upper surface and the lower surface using a common exposure device using existing photo etching technology. Since the patterning of the electrode film using the oblique exposure in the related art is not required, the flexural vibrator element according to the aspect of the invention can be manufactured with relative ease and at low cost.

Still another aspect of the invention provides a high-performance and miniaturized electronic device at low cost by providing the flexural vibrator element according to the aspect of the invention described above to the electronic device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, some preferred embodiments of the invention will be described in detail with reference to the accompanying drawings. It should be noted that in the accompanying drawings, the same or similar constituents are shown with the same or similar reference symbols.

Figure 1A:
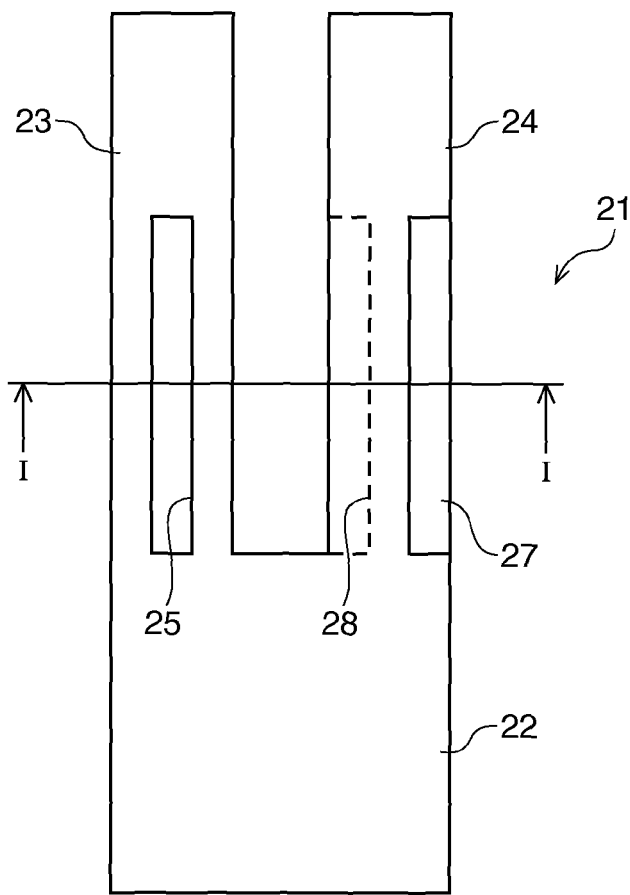
FIG. 1A is a schematic plan view of a flexural vibrator element according to a first embodiment of the invention.
Figure 1B:
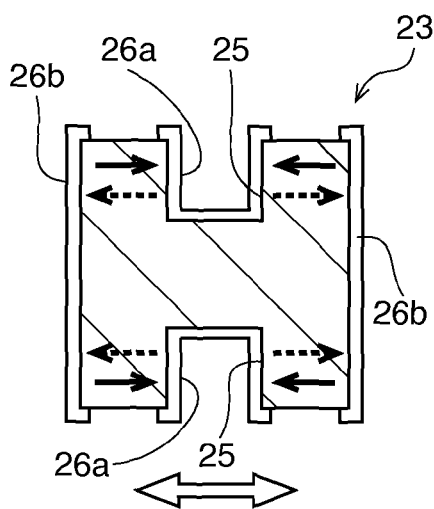
FIG. 1B is a cross-sectional view of a driving vibrator arm in the line I-I shown in FIG. 1A.
Figure 1C:
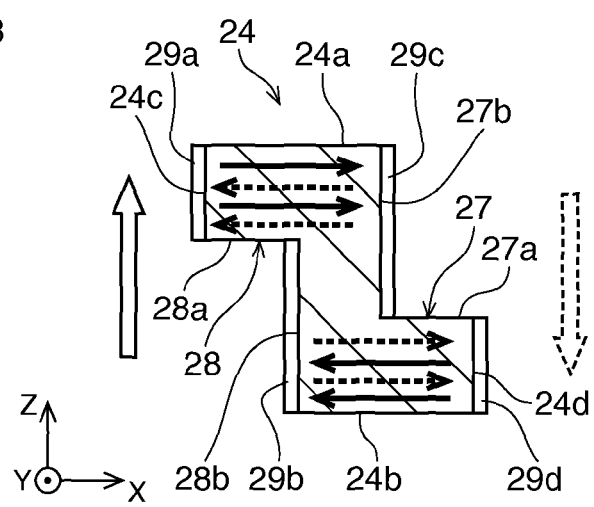
FIG. 1C is a cross-sectional view of a detecting vibrator arm in the same line.

FIGS. 1A through 1C schematically show a tuning-fork flexural vibrator element according to a first embodiment of the invention for piezoelectric vibrating gyroscope used for, for example, an angular velocity sensor. The tuning-fork flexural vibrator element 21 is provided with a base section 22 having a rectangular shape, a driving vibrator arm 23 extending from the base section, and a detecting vibrator arm 24 extending from the base section along the driving vibrator arm. The driving vibrator arm 23 and the detecting vibrator arm 24 each have a polygonal cross-sectional shape having upper and lower surfaces, and right and left side surfaces, and are disposed in parallel to each other. The tuning-fork flexural vibrator element 21 is integrally formed from a quartz crystal or other piezoelectric material.

As shown in FIG. 1B, the driving vibrator arm 23 has grooves 25 respectively formed on the upper and lower surface thereof in the longitudinal direction. On the inner surfaces of the grooves 25 disposed in the longitudinal direction, there are respectively disposed first drive electrodes 26a, on the left and right side surfaces of the driving vibrator arm 23, there are respectively disposed second drive electrodes 26b, and the first drive electrodes 26a and the second drive electrodes 26b are each connected electrically to each other to constitute the drive electrodes for flexurally driving the driving vibrator arm 3.

As shown in FIG. 1C, the detecting vibrator arm 24 is provided with a first step section 27 facing upward disposed between an upper surface 24a and a right side surface 24d, and a second step section 28 facing downward disposed between a lower surface 24b and a left side surface 24c. The first step section 27 has a step surface 27a facing upward intersecting with the right side surface 24d, and a step side surface 27b facing right intersecting with the upper surface. The second step section 28 has a step surface 28a facing downward intersecting with the left side surface 24c, and a step side surface 28b facing left intersecting with the lower surface. The first and second step sections 27, 28 are formed to have the same dimensions symmetrically in the cross-section of the vibrator arm about the center axis thereof.

The left and right side surfaces 24c, 24d of the detecting vibrator arm 24 and the step side surfaces 27b, 28b are respectively provided with first through fourth detection electrodes 29a through 29d to thereby constitute the detection electrodes for detecting the flexural vibration in the out-of-plane direction thereof. The first detection electrode 29a of the left side surface 24c and the second detection electrode 29b of the step side surface 28b are separated in the thickness direction of the vibrator arm by the step surface 28a provided with no electrode film, and are disposed to have respective polarities different from each other. Similarly, the third detection electrode 29c of the step side surface 27b and the fourth detection electrode 29d of the right side surface 24d are separated in the thickness direction of the vibrator arm by the step surface 27a provided with no electrode film, and are disposed to have respective polarities different from each other. It should be noted that although the entire areas of the step surfaces 27a, 28a are provided with no electrode film in the drawing, it is also possible to separate the first and second detection electrodes, and the third and fourth detection electrodes, respectively, in the case in which the electrode film is only partially eliminated.

Since the step surfaces 27a, 28a of the first and second step sections provided with no electrode film can be irradiated vertically with the exposure light when patterning the electrode film formed on the surface of vibrator arm using photo etching, the double-sided exposure using a common exposure device can be performed without using a special device or method. Therefore, even a fine pattern can be transferred with relative ease and high accuracy. Therefore, it is possible to reduce the fraction defective in manufacturing to thereby improve the yield, and reduce the manufacturing cost, and at the same time to sufficiently meet the downsizing of the flexural vibrator element.

When applying a predetermined alternating-current voltage to the drive electrodes, the electrical fields are generated between the first and second drive electrodes 26a, 26b adjacent to each other in a direction reversed alternately along the X-axis direction as indicated by the solid and dotted arrows in FIG. 1B. Thus, the driving vibrator arm 23 vibrates flexurally in the X-Y plane the same as the upper and lower surfaces. The detecting vibrator arm 24 also vibrates flexurally in the X-Y plane in the opposite direction to the driving vibrator arm 23 so as to achieve a balance with the driving vibrator arm 23.

In this state, when the flexural vibrator element 21 rotates around the Y axis, namely around the extension direction of the vibrator arm, the Coriolis force acts in a direction perpendicular to the vibration direction of the driving vibrator arm 23, namely the Z-axis direction perpendicular to the upper and lower surfaces. Thus, the driving vibrator arm 23 and the detecting vibrator arm 24 vibrate flexurally in respective directions opposite to each other along the Z-axis direction. On this occasion, in the detecting vibrator arm 24, the electrical fields along the X-axis direction are generated between the first detection electrode 29a of the left side surface 24c and the third detection electrode 29c of the step side surface 27b corresponding thereto, and between the second detection electrode 29b of the step side surface 28b and the fourth detection electrode 29d of the right side surface 24d corresponding thereto, in the respective directions opposite to each other, and each reversed alternately as indicated by the solid and dotted arrows in FIG. 1C. Thus, the angular velocity of the rotation of the flexural vibrator element 21 is detected by taking out the charge generated in the X-axis direction from the detection electrodes as a voltage signal.

Since the distance between the detection electrodes corresponding to the lateral direction, namely the X-axis direction, becomes smaller than before by disposing the detection electrode, which corresponds to the detection electrode on one of the side surfaces, on the step side surface as described above, the capacitance thereof increases. Therefore, the charge caused between the detection electrodes by the flexural vibration in the out-of-plane direction of the detecting vibrator arm 24 can efficiently be detected, and thus the high sensitivity can be obtained.

In the present embodiment, since the first and second step sections 27, 28 are formed to have the same dimensions symmetrically to each other, the flexural vibrator element 21 vibrates flexurally in the out-of-plane direction in a balanced manner. Further, the distances between the respective pairs of detection electrodes corresponding to each other in the X-axis direction are equal to each other. In other words, the distance between the first detection electrode 29a and the third detection electrode 29c on the upper surface side and the distance between the second detection electrode 29b and the fourth detection electrode 29d on the lower surface side are equal to each other. Therefore, the voltage signal detected on the upper surface side and the lower surface side of the flexural vibrator element 21 is output in a balanced manner.

Further, by using the differential signal of the output between the first and third detection electrodes 29a, 29c on the upper surface side of the flexural vibrator element 21 and the output between the second and fourth detection electrodes 29b, 29d on the lower surface side thereof, unwanted noise can be canceled. For example, in the case in which the detecting vibrator arm 24 expands or contracts in the axial direction, namely in the Y-axis direction, the unwanted signal which can be caused accordingly can be removed. Thus, more accurate detection of the generated charge becomes possible.

In another specific example, it is possible to set the electrodes on one side surface side, for example, the first detection electrode 29a and the second detection electrode 29b on the left side surface side, to the ground electrodes. In this case, the voltage signals having respective polarities different from each other are output from the third detection electrode 29c and the fourth detection electrode 29d on the opposite side. By adopting such a configuration, the difference between the outputs can easily be taken between the upper surface side and the lower surface side of the detecting vibrator arm 24, and the structure of the wiring drawn from the detection electrodes can be simplified.

Figure 2A:
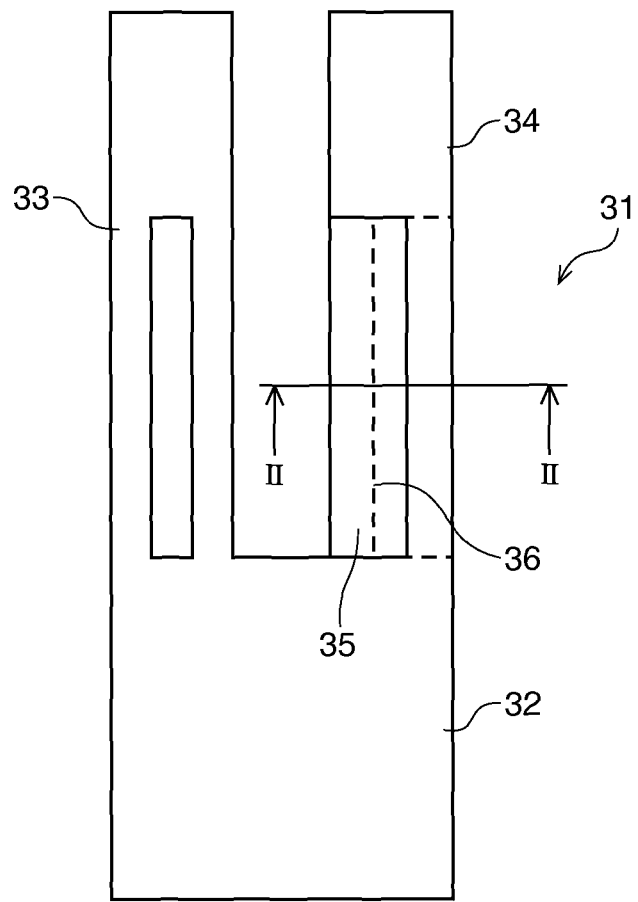
FIG. 2A is a schematic plan view of a flexural vibrator element according to a second embodiment of the invention.
Figure 2B:
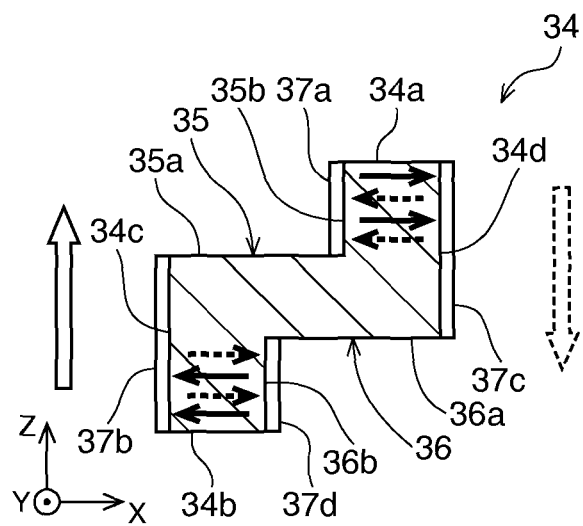
FIG. 2B is a cross-sectional view of a detecting vibrator arm in the line II-II shown in FIG. 2A.

FIGS. 2A and 2B schematically show a tuning-fork flexural vibrator element according to a second embodiment of the invention. The tuning-fork flexural vibrator element 31 according to the second embodiment is provided with a base section 32 having a rectangular shape, and a driving vibrator arm 33 and a detecting vibrator arm 34 extending from the base section in parallel to each other, each having a polygonal cross-sectional shape having an upper surface, a lower surface, and right and left side surfaces similarly to the case of the first embodiment. Since the driving vibrator arm 33 has the same configuration as that of the driving vibrator arm 23 of the first embodiment, the explanation therefor will be omitted.

As shown in FIG. 2B, the detecting vibrator arm 34 is provided with a first step section 35 facing upward disposed between an upper surface 34a and a left side surface 34c, and a second step section 36 facing downward disposed between a lower surface 34b and a right side surface 34d. The first step section 35 has a step surface 35a facing upward intersecting with the left side surface 34c, and a step side surface 35b facing left intersecting with the upper surface 34a. The second step section 36 has a step surface 36a facing downward intersecting with the right side surface 34d, and a step side surface 36b facing right intersecting with the lower surface 34b.

Similarly to the case of the first embodiment, the first and second step sections 35, 36 are formed to have the same dimensions symmetrically in the cross-section of the vibrator arm about the center axis thereof. In the present embodiment, the first and second step sections 35, 36 are formed to be smaller in depth and larger in width than those in the first embodiment. Therefore, the distance between the step side surfaces 35b, 36b and the left and right side surfaces 34c, 34d corresponding respectively thereto is smaller than that in the first embodiment, and the height of each of the step side surface 35b, 36b is lower than that in the first embodiment.

The left and right side surfaces 34c, 34d of the detecting vibrator arm 34 and the step side surfaces 35b, 36b are respectively provided with first through fourth detection electrodes 37a through 37d to thereby constitute the detection electrodes for detecting the flexural vibration in the out-of-plane direction thereof. The first detection electrode 37a of the step side surface 35b and the second detection electrode 37b of the left side surface 34c are separated in the thickness direction of the vibrator arm by the step surface 35a provided with no electrode film, and are disposed to have respective polarities different from each other. Similarly, the third detection electrode 37c of the right side surface 34d and the fourth detection electrode 37d of the step side surface 36b are separated in the thickness direction of the vibrator arm by the step surface 36a provided with no electrode film, and are disposed to have respective polarities different from each other. It should be noted that although the entire areas of the step surfaces 35a, 36a are provided with no electrode film in the drawing, it is also possible to separate the first and second detection electrodes, and the third and fourth detection electrodes, respectively, in the case in which the electrode film is only partially eliminated.

When the flexural vibrator element 31 rotates around the Y axis in the state in which a predetermined alternating-current voltage is applied to make the driving vibrator arm 33 and the detecting vibrator arm 34 vibrate flexurally in the X-Y plane in the respective directions opposite to each other, the both vibrator arms vibrate flexurally in the respective directions opposite to each other along the Z-axis direction due to the action of the Coriolis force. On this occasion, in the detecting vibrator arm 34, the electrical fields along the X-axis direction are generated between the first detection electrode 37a of the step side surface 35b and the third detection electrode 37c of the right side surface 34d corresponding thereto, and between the fourth detection electrode 37d of the step side surface 36b and the second detection electrode 37b of the left side surface 34c corresponding thereto, in the respective directions opposite to each other, and each reversed alternately as indicated by the solid and dotted arrows in FIG. 2B.

Thus, the charge generated in the X-axis direction is taken out from the detection electrodes as a voltage signal.

In another specific example, it is possible to set the electrodes on one side surface side, for example, the first detection electrode 37a and the second detection electrode 37b on the left side surface side, to the ground electrodes. In this case, the voltage signals having respective polarities different from each other are output from the third detection electrode 37c and the fourth detection electrode 37d on the opposite side. By adopting such a configuration, the difference between the outputs can easily be taken between the upper surface side and the lower surface side of the detecting vibrator arm 34, and the structure of the wiring drawn from the detection electrodes can be simplified.

In the present embodiment, since the distance between the detection electrodes corresponding to each other in the lateral direction, namely in the X-axis direction, becomes smaller than in the first embodiment, the capacitance thereof further increases. Therefore, the charge caused between the detection electrodes by the flexural vibration in the out-of-plane direction of the detecting vibrator arm 34 can more efficiently be detected, and thus the higher sensitivity can be obtained. Other advantages are the same as those in the first embodiment, and therefore, the explanation therefor will be omitted.

Figure 3A:
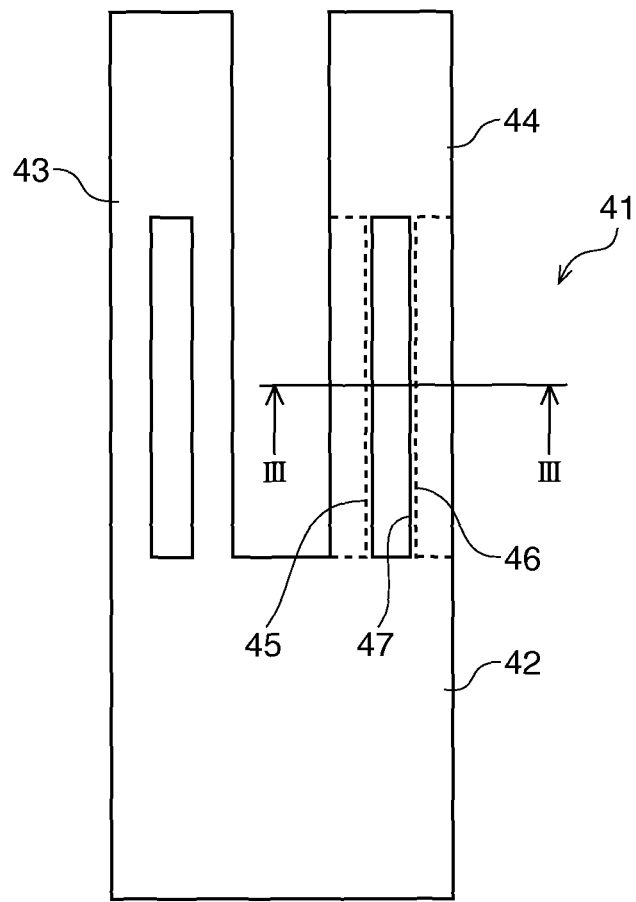
FIG. 3A is a schematic plan view of a flexural vibrator element according to a third embodiment of the invention.
Figure 3B:
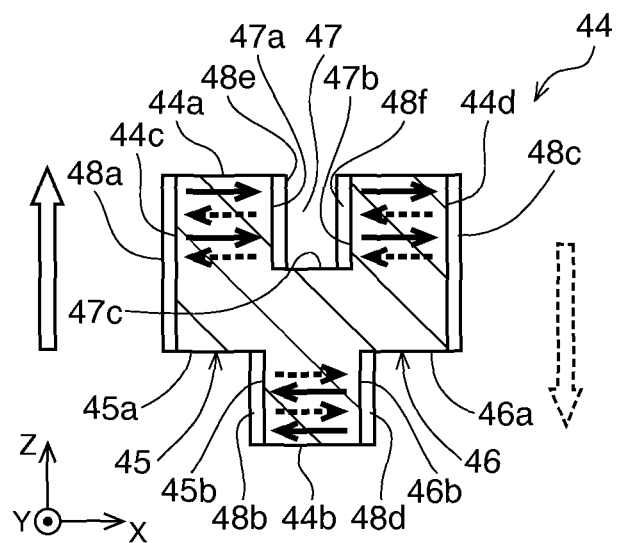
FIG. 3B is a cross-sectional view of a detecting vibrator arm in the line III-III shown in FIG. 3A.

FIGS. 3A and 3B schematically show a tuning-fork flexural vibrator element according to a third embodiment of the invention. The tuning-fork flexural vibrator element 41 according to the third embodiment is provided with a base section 42 having a rectangular shape, and a driving vibrator arm 43 and a detecting vibrator arm 44 extending from the base section in parallel to each other, each having a polygonal cross-sectional shape having an upper surface, a lower surface, and right and left side surfaces similarly to the case of the first embodiment. Since the driving vibrator arm 43 has the same configuration as that of the driving vibrator arm 23 of the first embodiment, the explanation therefor will be omitted.

As shown in FIG. 3B, the detecting vibrator arm 44 is provided with a first step section 45 facing downward disposed between a lower surface 44b and a left side surface 44c, and a second step section 46 facing downward disposed between the lower surface and a right side surface 44d. The first step section 45 has a step surface 45a facing downward intersecting with the left side surface 44c, and a step side surface 45b facing left intersecting with the lower surface 44b. The second step section 46 has a step surface 46a facing downward intersecting with the right side surface 44d, and a step side surface 46b facing right intersecting with the lower surface. The detecting vibrator arm 44 further has a longitudinal groove 47 formed on the upper surface 44a. The longitudinal groove 47 has left and right groove side surfaces 47a, 47b each intersecting with the upper surface, and a bottom surface 47c between the groove side surfaces.

The first and second step sections 45, 46, and the longitudinal groove 47 are disposed symmetrically in the vibrator arm cross-section about the center axis in the vertical direction. Therefore, the flexural vibrator element 41 has an advantage of vibrating flexurally in the out-of-plane direction in a balanced manner, and hardly generating unwanted vibration.

The left and right side surfaces 44c, 44d of the detecting vibrator arm 44 and the step side surfaces 45b, 46b are respectively provided with first through fourth detection electrodes 48a through 48d, and the groove side surfaces 47a, 47b of the longitudinal groove 47 are respectively provided with fifth and sixth detection electrodes 48e, 48f to thereby constitute the detection electrodes for detecting the flexural vibration in the out-of-plane direction thereof. The first detection electrode 48a of the left side surface 44c and the second detection electrode 48b of the step side surface 45b are separated in the thickness direction of the vibrator arm by the step surface 45a provided with no electrode film, and are disposed to have respective polarities different from each other. Similarly, the third detection electrode 48c of the right side surface 44d and the fourth detection electrode 48d of the step side surface 46b are separated in the thickness direction of the vibrator arm by the step surface 46a provided with no electrode film, and are disposed to have respective polarities different from each other. The fifth detection electrode 48e and the sixth detection electrode 48f inside the longitudinal groove 47 are separated in the width direction of the vibrator arm by the bottom surface 47c of the groove provided with no electrode film, and are disposed to have respective polarities different from each other. It should be noted that although the entire areas of the step surfaces 45a, 46a are provided with no electrode film in the drawing, it is also possible to separate the first and second detection electrodes, and the third and fourth detection electrodes, respectively, in the case in which the electrode film is only partially eliminated.

When the flexural vibrator element 41 rotates around the Y axis in the state in which a predetermined alternating-current voltage is applied to make the driving vibrator arm 43 and the detecting vibrator arm 44 vibrate flexurally in the X-Y plane in the respective directions opposite to each other, the both vibrator arms vibrate flexurally in the respective directions opposite to each other along the Z-axis direction due to the action of the Coriolis force. On this occasion, on the upper surface side of the detecting vibrator arm 44, the electrical fields along the X-axis direction are generated between the first detection electrode 48a of the left side surface 44c and the fifth detection electrode 48e of the left groove side surface 47a corresponding thereto, and between the sixth detection electrode 48f of the right groove side surface 47b and the third detection electrode 48c of the right side surface 44d corresponding thereto, in the respective directions the same as each other, and each reversed alternately as indicated by the solid and dotted arrows in FIG. 3B. On the lower surface side of the detecting vibrator arm 44, the electrical field along the X-axis direction is generated between the second detection electrode 48b of the step side surface 45b and the fourth detection electrode 48d of the step side surface 46b corresponding thereto in a direction reversed alternately and opposite to the direction of the electrical field along the X-axis direction on the upper surface side described above. Thus, the charge generated in the X-axis direction is taken out from the detection electrodes as a voltage signal.

In another specific example, it is possible to set the electrodes on one side surface side, for example, the first detection electrode 48a and the second detection electrode 48b on the left side surface side, and the sixth detection electrode 48f of the right groove side surface 47b of the longitudinal groove, to the ground electrodes. In this case, the voltage signal output from the third detection electrode 48c and the fifth detection electrode 48e and the voltage signal output from the fourth detection electrode 48d have respective polarities different from each other. By adopting such a configuration, the differential signal of the output between the upper surface side and the lower surface side of the detecting vibrator arm 44 can easily be obtained.

In the present embodiment, since the capacitance between the detection electrodes is roughly twice as large as in the second embodiment on the upper surface side of the detecting vibrator arm 44, the charge thus generated can more efficiently be detected, and thus, the far higher sensitivity can be obtained. Other advantages are the same as those in the first embodiment, and therefore, the explanation therefor will be omitted.

Figure 4A:
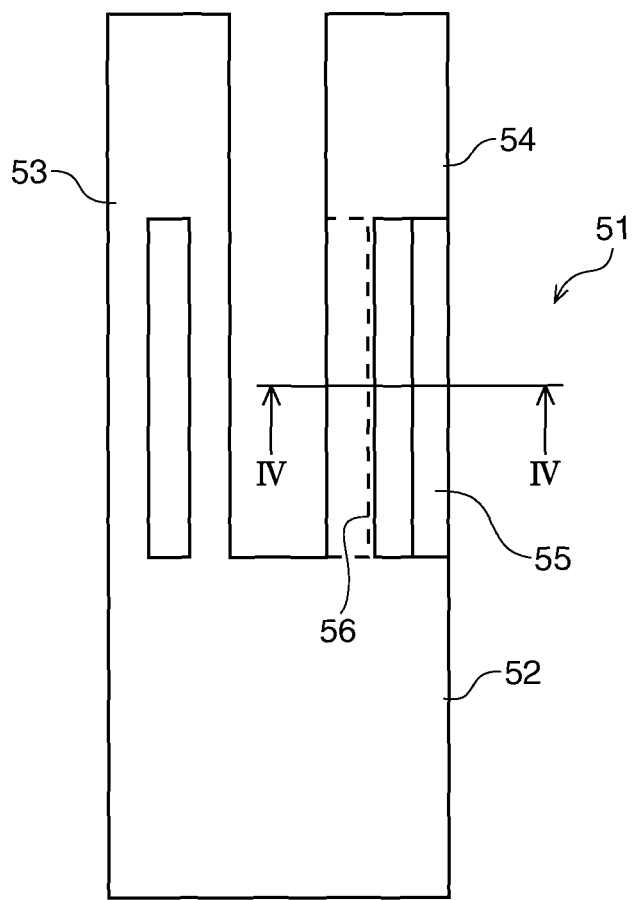
FIG. 4A is a schematic plan view of a flexural vibrator element according to a fourth embodiment of the invention.
Figure 4B:
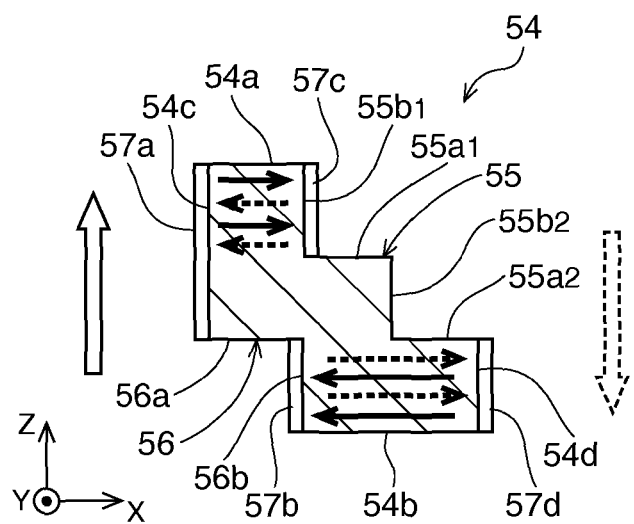
FIG. 4B is a cross-sectional view of a detecting vibrator arm in the line IV-IV shown in FIG. 4A.

FIGS. 4A and 4B schematically show a tuning-fork flexural vibrator element according to a fourth embodiment of the invention. The tuning-fork flexural vibrator element 51 according to the fourth embodiment is provided with a base section 52 having a rectangular shape, and a driving vibrator arm 53 and a detecting vibrator arm 54 extending from the base section in parallel to each other, each having a polygonal cross-sectional shape having an upper surface, a lower surface, and right and left side surfaces similarly to the case of the first embodiment. Since the driving vibrator arm 53 has the same configuration as that of the driving vibrator arm 23 of the first embodiment, the explanation therefor will be omitted.

As shown in FIG. 4B, the detecting vibrator arm 54 is provided with a first step section 55 facing upward disposed between an upper surface 54a and a left side surface 54c, and a second step section 56 facing downward disposed between a lower surface 54b and a right side surface 54d. The first step section 55 is composed of two steps continuing one above the other. The two steps respectively have step surfaces 55a1, 55a2 facing upward, and step side surfaces 55b1, 55b2 facing right. The step side surface 55b1 on the upper side intersects with the upper surface 54a, the step surface 55a2 on the lower side intersects with the right side surface 54d, and step surface 55a1 on the upper side intersects with the step side surface 55b2 on the lower side. The second step section 56 has a step surface 56a facing downward intersecting with the left side surface 54c, and a step side surface 56b facing left intersecting with the lower surface. Thus, the cross-sectional shape of the detecting vibrator arm can be designed so that the detecting vibrator arm can vibrate flexurally in a well-balanced manner.

The left and right side surfaces 54c, 54d of the detecting vibrator arm 54 and the step side surfaces 55b1, 56b are respectively provided with first through fourth detection electrodes 57a through 57d to thereby constitute the detection electrodes for detecting the flexural vibration in the out-of-plane direction thereof. The first detection electrode 57a of the left side surface 54c and the second detection electrode 57b of the step side surface 56b are separated in the thickness direction of the vibrator arm by the step surface 56a provided with no electrode film, and are disposed to have respective polarities different from each other. Similarly, the third detection electrode 57c of the step side surface 55b1 and the fourth detection electrode 57d of the right side surface 54d are separated in the thickness direction of the vibrator arm by the step surfaces 55a1, 55a2 provided with no electrode film, and are disposed to have respective polarities different from each other. It should be noted that although the entire areas of the step surfaces 55a1, 55a2, and 56a are provided with no electrode film in the drawing, it is also possible to separate the first and second detection electrodes, and the third and fourth detection electrodes, respectively, in the case in which the electrode film is only partially eliminated.

When the flexural vibrator element 51 rotates around the Y axis in the state in which a predetermined alternating-current voltage is applied to make the driving vibrator arm 53 and the detecting vibrator arm 54 vibrate flexurally in the X-Y plane in the respective directions opposite to each other, the both vibrator arms vibrate flexurally in the respective directions opposite to each other along the Z-axis direction due to the action of the Coriolis force. On this occasion, in the detecting vibrator arm 54, the electrical fields along the X-axis direction are generated between the first detection electrode 57a of the left side surface 54c and the third detection electrode 57c of the step side surface 55b1 corresponding thereto, and between the second detection electrode 57b of the step side surface 56b and the fourth detection electrode 57d of the right side surface 54d corresponding thereto, in the respective directions opposite to each other, and each reversed alternately as indicated by the solid and dotted arrows in FIG. 4B. Thus, the charge generated in the X-axis direction is taken out from the detection electrodes as a voltage signal.

In another specific example, the third detection electrode 57c can be disposed on the step side surface 55b2 on the lower side instead of the step side surface 55b1 on the upper side. Further, it is also possible to dispose the detection electrode on both of the step side surfaces 55b1, 55b2 on the upper and lower sides of the first step section 55. In such a manner, it is possible to control the distance and the capacitance between the first detection electrode 57a of the left side surface and the detection electrode corresponding thereto in accordance with the use conditions.

Further, in another specific example, it is possible to set the electrodes on one side surface side, for example, the first detection electrode 57a and the second detection electrode 57b on the left side surface side, to the ground electrodes. In this case, the voltage signals having respective polarities different from each other are output from the third detection electrode 57c and the fourth detection electrode 57d on the opposite side. By adopting such a configuration, the difference between the outputs can easily be taken between the upper surface side and the lower surface side of the detecting vibrator arm 54, and the structure of the wiring drawn from the detection electrodes can be simplified.

It is not necessarily required to continuously dispose the upper step and the lower step of the first step section. For example, in another specific example, it is possible to connect the upper step and the lower step with a sloped surface. In still another embodiment, it is also possible to constitute the first step section with three or more steps.

In the present embodiment, since the distance between the detection electrodes corresponding to each other in the lateral direction, namely in the X-axis direction, becomes smaller than in the first embodiment on the upper surface side, the capacitance thereof further increases. Therefore, the charge caused between the detection electrodes by the flexural vibration in the out-of-plane direction of the detecting vibrator arm 54 can more efficiently be detected, and thus the higher sensitivity can be obtained. Other advantages are the same as those in the first embodiment, and therefore, the explanation therefor will be omitted.

Figure 5A:
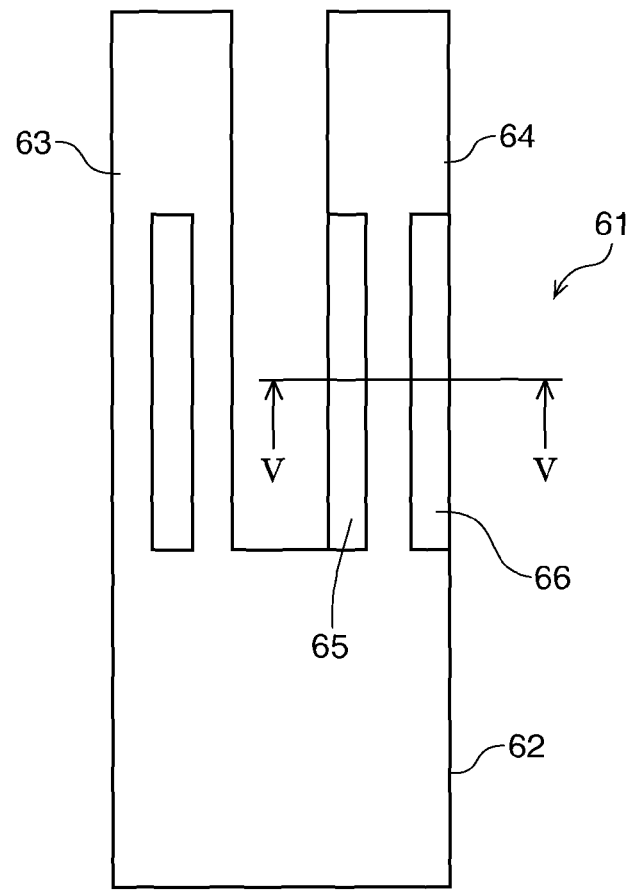
FIG. 5A is a schematic plan view of a flexural vibrator element according to a fifth embodiment of the invention.
Figure 5B:
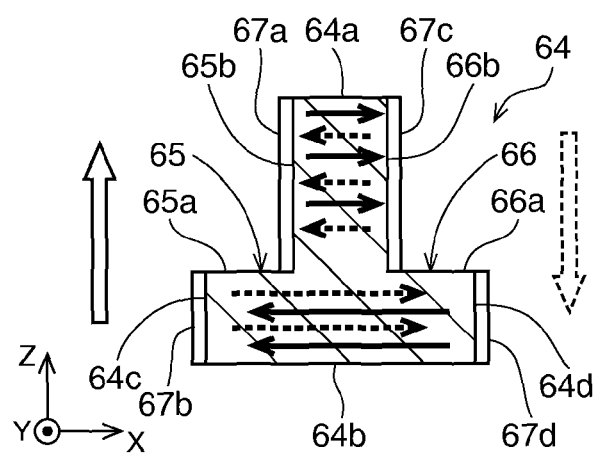
FIG. 5B is a cross-sectional view of a detecting vibrator arm in the line V-V shown in FIG. 5A.

FIGS. 5A and 5B schematically show a tuning-fork flexural vibrator element according to a fifth embodiment of the invention. The tuning-fork flexural vibrator element 61 according to the fifth embodiment is provided with a base section 62 having a rectangular shape, and a driving vibrator arm 63 and a detecting vibrator arm 64 extending from the base section in parallel to each other, each having a polygonal cross-sectional shape having an upper surface, a lower surface, and right and left side surfaces similarly to the case of the first embodiment. Since the driving vibrator arm 63 has the same configuration as that of the driving vibrator arm 23 of the first embodiment, the explanation therefor will be omitted.

As shown in FIG. 5B, the detecting vibrator arm 64 is provided with a first step section 65 and a second step section 66 facing upward respectively disposed between an upper surface 64a and a left side surface 64c and between the upper surface 64a and a right side surface 64d. The first and second step sections 65, 66 have step surfaces 65a, 66a facing upward intersecting with the left and right side surfaces 64c, 64d, and left and right step side surfaces 65b, 66b intersecting with the upper surface, respectively. The first and second step sections are disposed symmetrically in the vibrator arm cross-section about the center axis in the vertical direction. Therefore, the flexural vibrator element 61 has an advantage of vibrating flexurally in the out-of-plane direction in a balanced manner, and hardly generating unwanted vibration.

The left and right side surfaces 64c, 64d of the detecting vibrator arm 64 and the step side surfaces 65b, 66b are respectively provided with first through fourth detection electrodes 67a through 67d to thereby constitute the detection electrodes for detecting the flexural vibration in the out-of-plane direction thereof. The first detection electrode 67a of the step side surface 65b and the second detection electrode 67b of the left side surface 64c are separated in the thickness direction of the vibrator arm by the step surface 65a provided with no electrode film, and are disposed to have respective polarities different from each other. Similarly, the third detection electrode 67c of the step side surface 66b and the fourth detection electrode 67d of the right side surface 64d are separated in the thickness direction of the vibrator arm by the step surface 66a provided with no electrode film, and are disposed to have respective polarities different from each other. It should be noted that although the entire areas of the step surfaces 65a, 66a are provided with no electrode film in the drawing, it is also possible to separate the first and second detection electrodes, and the third and fourth detection electrodes, respectively, in the case in which the electrode film is only partially eliminated.

When the flexural vibrator element 61 rotates around the Y axis in the state in which a predetermined alternating-current voltage is applied to make the driving vibrator arm 63 and the detecting vibrator arm 64 vibrate flexurally in the X-Y plane in the respective directions opposite to each other, the both vibrator arms vibrate flexurally in the respective directions opposite to each other along the Z-axis direction due to the action of the Coriolis force. On this occasion, in the detecting vibrator arm 64, the electrical fields along the X-axis direction are generated between the first detection electrode 67a of the step side surface 65b and the third detection electrode 67c of the step side surface 66b corresponding thereto, and between the second detection electrode 67b of the left side surface 64c and the fourth detection electrode 67d of the right side surface 64d corresponding thereto, in the respective directions opposite to each other, and each reversed alternately as indicated by the solid and dotted arrows in FIG. 5B. Thus, the charge generated in the X-axis direction is taken out from the detection electrodes as a voltage signal.

In another specific example, it is possible to set the electrodes on one side surface side, for example, the first detection electrode 67a and the second detection electrode 67b on the left side surface side, to the ground electrodes. In this case, the voltage signals having respective polarities different from each other are output from the third detection electrode 67c and the fourth detection electrode 67d on the opposite side. By adopting such a configuration, the difference between the outputs can easily be taken between the upper surface side and the lower surface side of the detecting vibrator arm 64, and the structure of the wiring drawn from the detection electrodes can be simplified.

Since the first and second step sections 65, 66 are formed only on the upper surface of the detecting vibrator arm 64 in the present embodiment, there can be obtained an advantage that the processing of the outer shape of the flexural vibrator element 61 can easily be performed with smaller man-hour in addition to the advantages of the first embodiment. Further, since the exposure from the upper surface side is only required for patterning the detection electrodes separated in the thickness direction on the detecting vibrator arm 64, an advantage in manufacturing can be obtained.

Figure 6A:
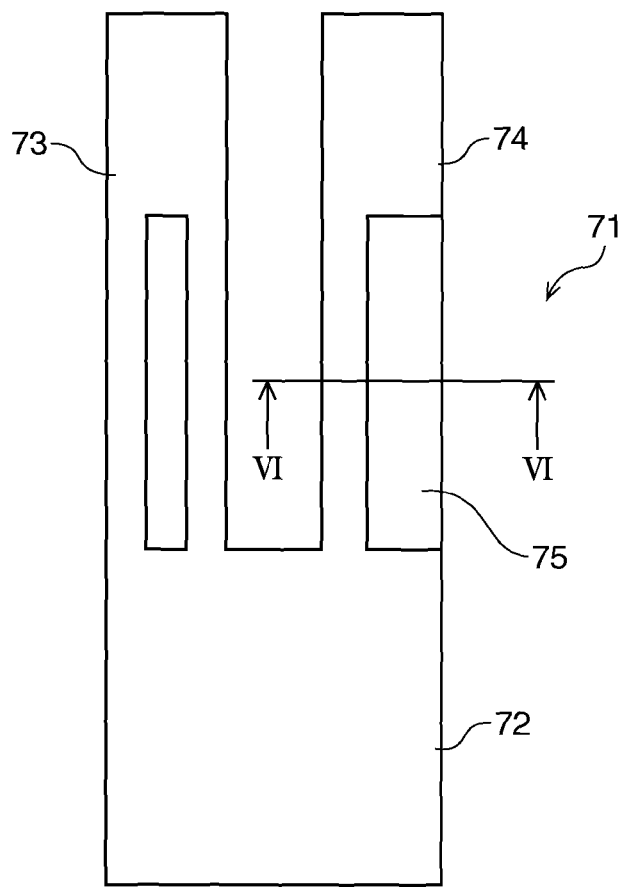
FIG. 6A is a schematic plan view of a flexural vibrator element according to a sixth embodiment of the invention.
Figure 6B:
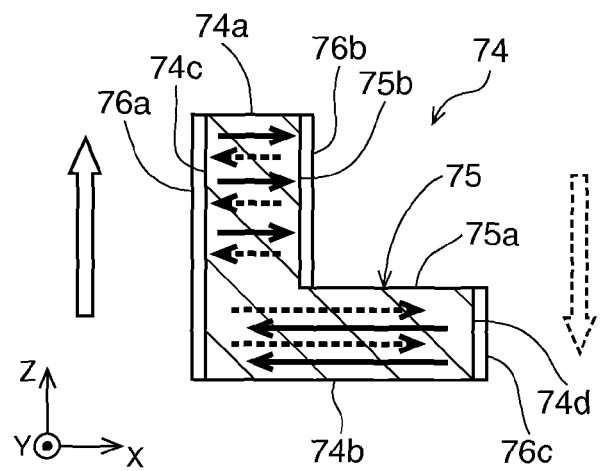
FIG. 6B is a cross-sectional view of a detecting vibrator arm in the line VI-VI shown in FIG. 6A.

FIGS. 6A and 6B schematically show a tuning-fork flexural vibrator element according to a sixth embodiment of the invention. The tuning-fork flexural vibrator element 71 according to the sixth embodiment is provided with a base section 72 having a rectangular shape, and a driving vibrator arm 73 and a detecting vibrator arm 74 extending from the base section in parallel to each other, each having a polygonal cross-sectional shape having an upper surface, a lower surface, and right and left side surfaces similarly to the case of the first embodiment. Since the driving vibrator arm 73 has the same configuration as that of the driving vibrator arm 23 of the first embodiment, the explanation therefor will be omitted.

As shown in FIG. 6B, the detecting vibrator arm 74 is provided with a step section 75 facing upward disposed between an upper surface 74a and a right side surface 74d. The step section 75 has a step surface 75a facing upward intersecting with the right side surface 74d, and a step side surface 75b facing right intersecting with the upper surface.

The left and right side surfaces 74c, 74d of the detecting vibrator arm and the step side surfaces 75b are respectively provided with first through third detection electrodes 76a through 76c to thereby constitute the detection electrodes for detecting the flexural vibration in the out-of-plane direction thereof. The second detection electrode 76b of the step side surface 75b and the third detection electrode 76c of the right side surface 74d are separated in the thickness direction of the vibrator arm by the step surface 75a provided with no electrode film, and are disposed to have respective polarities different from each other. It should be noted that although the entire area of the step surface 75a is provided with no electrode film in the drawing, it is also possible to separate the second and third detection electrodes in the case in which the electrode film is only partially eliminated.

When the flexural vibrator element 71 rotates around the Y axis in the state in which a predetermined alternating-current voltage is applied to make the driving vibrator arm 73 and the detecting vibrator arm 74 vibrate flexurally in the X-Y plane in the respective directions opposite to each other, the both vibrator arms vibrate flexurally in the respective directions opposite to each other along the Z-axis direction due to the action of the Coriolis force. On this occasion, in the detecting vibrator arm 74, the electrical fields along the X-axis direction are generated between the first detection electrode 76a of the left side surface 74c and the second detection electrode 76b of the step side surface 75b corresponding thereto, and between the first detection electrode and the third detection electrode 76c of the right side surface 74d corresponding thereto, in the respective directions opposite to each other, and each reversed alternately as indicated by the solid and dotted arrows in FIG. 6B. Thus, the charge generated in the X-axis direction is taken out from the detection electrodes as a voltage signal.

In another specific example, the first detection electrode 76a on the left side surface can be set to the ground electrode. In this case, the voltage signals having respective polarities different from each other are output from the second detection electrode 76b and the third detection electrode 76c on the opposite side. By adopting such a configuration, the differential signal of the output between the upper surface side and the lower surface side of the detecting vibrator arm 74 can easily be obtained.

Since the one step is only formed in the present embodiment, there can be obtained an advantage that the man-hour of processing of the outer shape of the flexural vibrator element 71 can be reduced, and processing of the outer shape of the flexural vibrator element 71 can easily be performed in addition to the advantages of the fifth embodiment described above. Further, since the number of detection electrode is as small as three, the wiring structure thereof can be simplified.

Figure 7A:
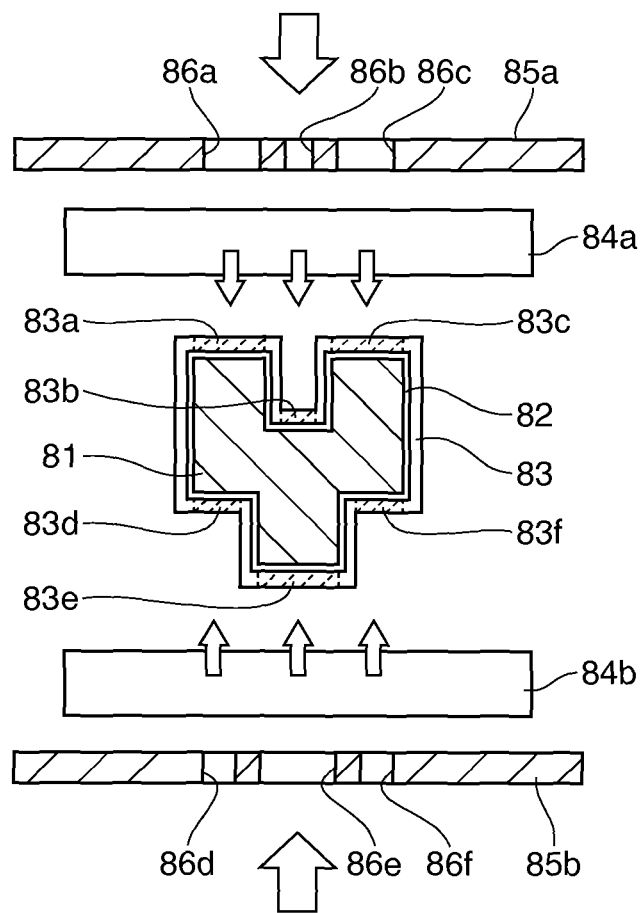
FIGS. 7A through 7D are process diagrams sequentially showing a procedure of patterning detection electrodes on the detecting vibrator arm of the flexural vibrator element according to the third embodiment.
Figure 7B:
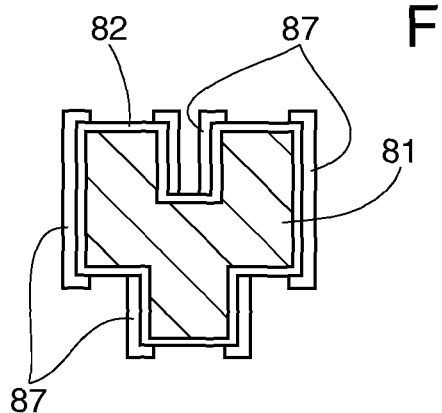
Figure 7C:
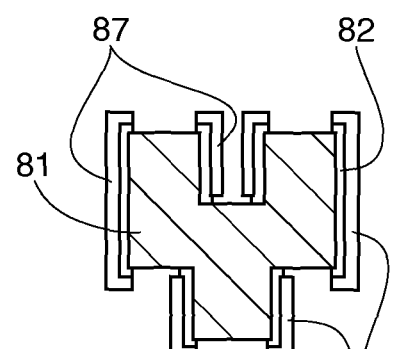

In the flexural vibrator element according to any one of the embodiments described above, the electrodes separated in the thickness direction can be formed on the side surface of the detecting vibrator arm by performing accurate patterning by the simultaneous exposure from the upper surface and the lower surface using a common exposure device using existing photo etching. FIGS. 7A through 7C show a preferable example of a process of patterning the detection electrodes on the detecting vibrator arm 43 of the tuning-fork flexural vibrator element 41 according to the third embodiment using the existing photo etching process described above.

Firstly, photo etching is performed on a wafer made of, for example, quartz crystal to thereby form a vibrator element segment having the outer shape of the flexural vibrator element 41. As shown in FIG. 7A, an electrode film 82 is made to adhere to the entire surface of a detecting vibrator arm 81 of the vibrator element segment provided with the first and second step sections 45, 46, and the longitudinal groove 47, and then a photoresist film 83 is applied to the electrode film 82. Projection lenses 84a, 84b are respectively disposed above and below the detecting vibrator arm 81, and photomasks 85a, 85b are respectively disposed above and below the projection lenses. The photomasks 85a, 85b are provided with openings 86a through 86f corresponding respectively to areas 83a through 83f of the photoresist film 83 intended to be exposed. Subsequently, the upper surface and the lower surface are simultaneously irradiated with ultraviolet light vertically through the projection lenses using a common exposure device. In another specific example, the exposure can be performed by irradiating either one of the upper surface side and the lower surface side with the ultraviolet light instead of irradiating the both sides simultaneously.

Figure 7D:
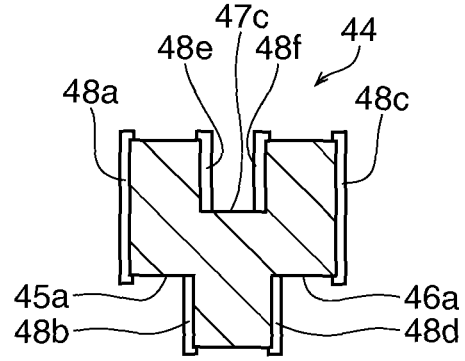

Subsequently, the photoresist film 83 is developed to thereby remove the areas 83a through 83f thus exposed, and form resist patterns 87, and thus exposing the electrode film 82 (FIG. 7B). The part of the electrode film 82 thus exposed is removed by wet etching to thereby expose the quartz crystal surface (FIG. 7C). Finally, by completely removing the residual resist pattern 87, there are formed the first detection electrode 48a of the left side surface 44c and the second detection electrode 48b of the step side surface 45b separated in the thickness direction by the step surface 45a with no electrode film, the third detection electrode 48c of the right side surface 44d and the fourth detection electrode 48d of the step side surface 46b separated in the thickness direction by the step surface 46a with no electrode film, and the fifth detection electrode 48e and the sixth detection electrode 48f separated in the width direction by the bottom surface 47c with no electrode film inside the longitudinal groove 47 (FIG. 7D).

It should be noted that in the accompanying drawings the step surfaces and the step side surfaces in each of the embodiments are described so as to be parallel or perpendicular to the upper and lower surfaces or the right and left side surfaces. However, attention should be paid to the fact that in the case of forming the flexural vibrator element from the single-crystal material such as a quartz crystal in the present embodiment, the step surfaces and the step side surfaces are not necessarily formed in parallel or perpendicularly to the upper and lower surfaces, or the right and left side surfaces due to the crystalline anisotropy thereof or other reasons.

Figure 8:
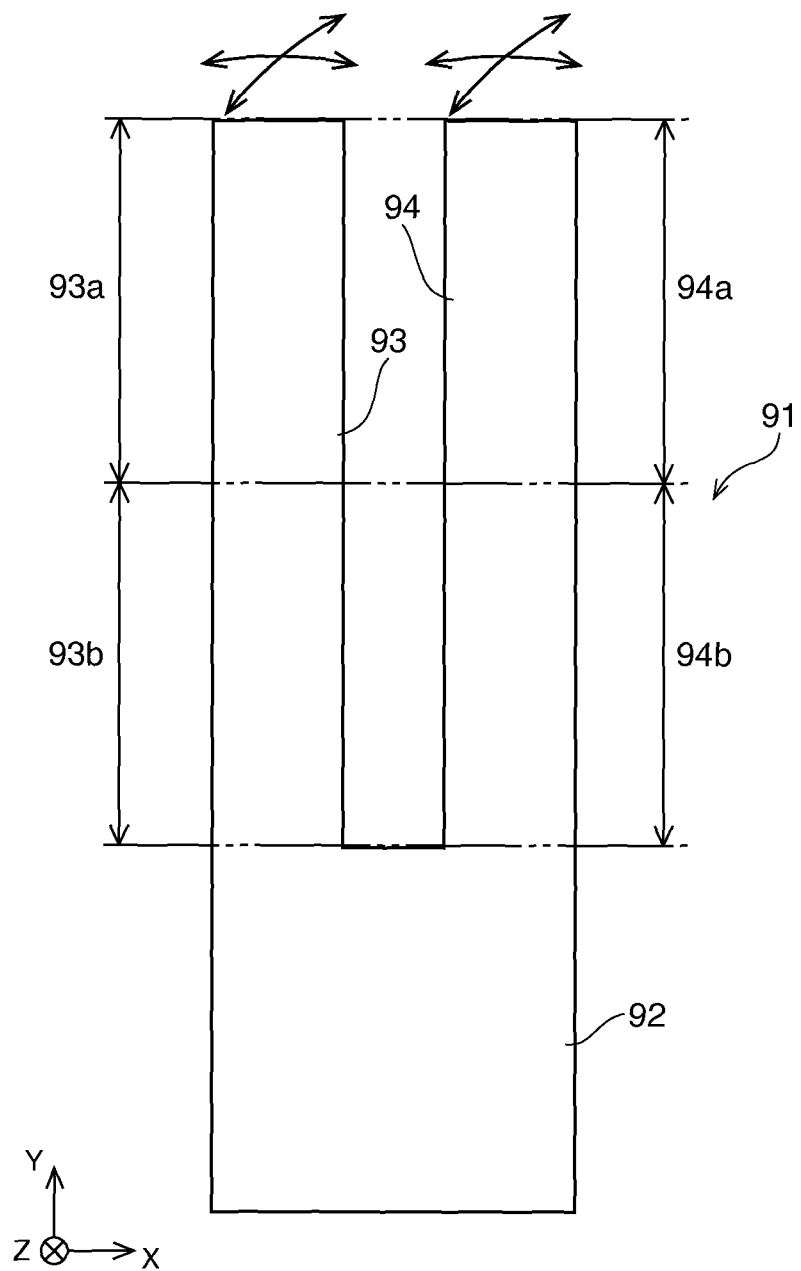
FIG. 8 is a schematic plan view showing another tuning-fork flexural vibrator element to which the invention is applied.

The flexural vibrator element according to the invention can similarly be applied to flexural vibrator elements with a variety of structures other than the tuning-fork type in each of the embodiments described above. FIG. 8 schematically shows another tuning-fork flexural vibrator element to which the invention is applied. The tuning-fork flexural vibrator element 91 is provided with a base section 92 having a rectangular shape, and a pair of vibrator arms 93, 94 extending from the base section in parallel to each other and each having a polygonal cross-sectional shape having an upper surface, a lower surface, and right and left side surfaces.

The vibrator arms 93, 94 are each divided in the extending direction into two parts, and respectively have drive sections 93a, 94a on the tip side and detection sections 93b, 94b on the base side. The drive sections are each constituted similarly to the driving vibrator arm 23 of the flexural vibrator element 21 according to the first embodiment, and each have substantially the same drive electrodes. The detection sections are each constituted similarly to either one of the detecting vibrator arms of the first through sixth embodiments described above, and each have substantially the same detection electrodes.

By applying a predetermined alternating-current voltage to the drive electrodes of the drive sections 93a, 94a, the both vibrator arms 93, 94 vibrate flexurally in the X-Y plane the same as the upper and lower surfaces in the directions of coming closer to and getting away from each other. In this state, if the flexural vibrator element 91 rotates around the Y axis, the both vibrator arms vibrate flexurally in the respective directions opposite to each other along the Z-axis direction perpendicular to the upper and lower surfaces due to the action of the Coriolis force. On this occasion, by detecting the voltage signals output from the detection electrodes of the both detection sections 93b, 94b, the angular velocity of the rotation of the flexural vibrator element 91 can be obtained with high sensitivity.

Figure 9:
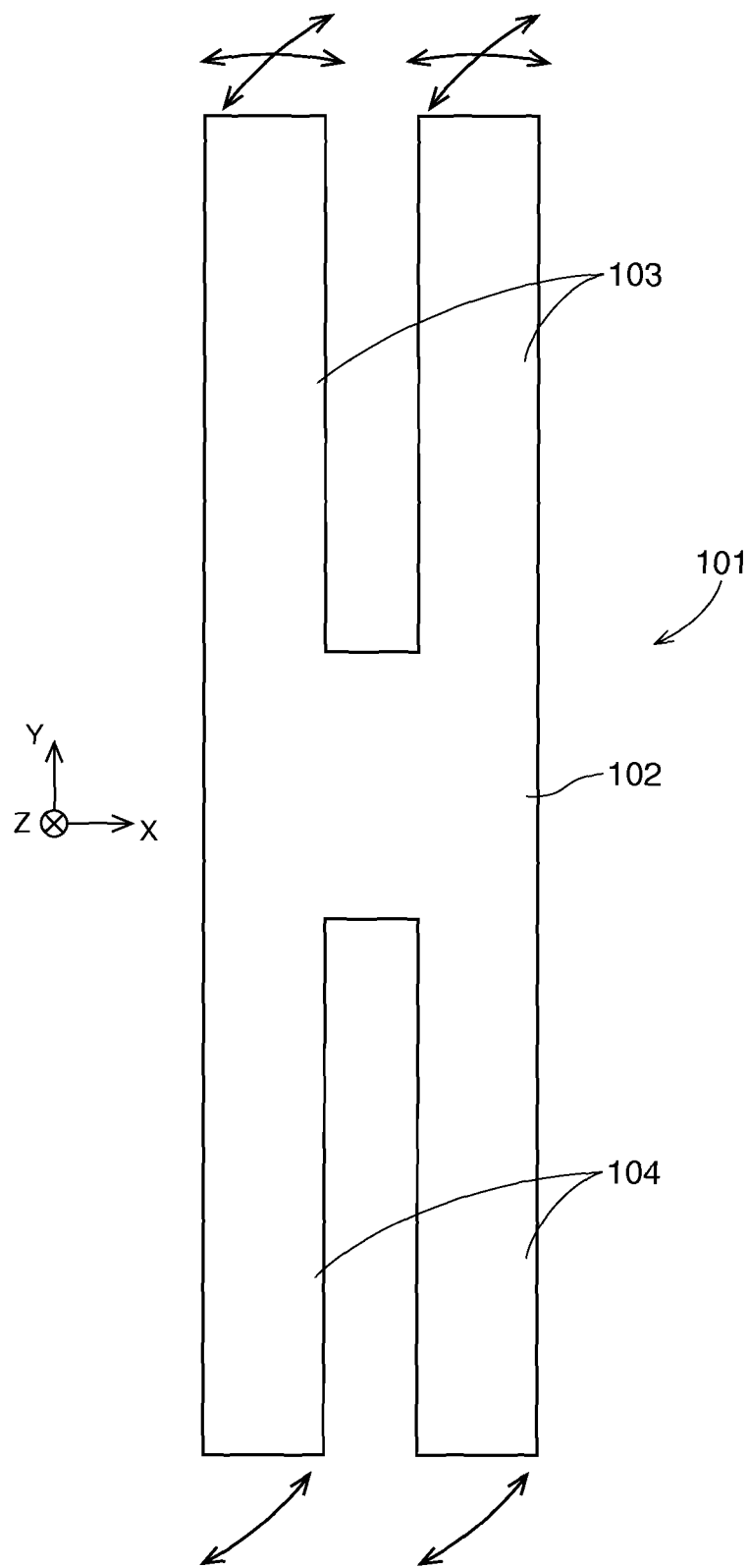
FIG. 9 is a schematic plan view showing a double tuning-fork flexural vibrator element to which the invention is applied.

FIG. 9 schematically shows a double tuning-fork flexural vibrator element to which the invention is applied. The double tuning-fork vibrator element 101 has a base section 102 having a rectangular shape, a pair of driving vibrator arms 103, 103 extending from the base section in parallel to each other and each having a polygonal cross-sectional shape having an upper surface, a lower surface, and right and left side surfaces, and a pair of detecting vibrator arms 104, 104 extending from the base section in the direction opposite to the driving vibrator arm and in parallel to each other and each having a polygonal cross-sectional shape having an upper surface, a lower surface, and right and left side surfaces.

The driving vibrator arms 103, 103 are each constituted similarly to the driving vibrator arm 23 of the flexural vibrator element 21 according to the first embodiment, and each have substantially the same drive electrodes. The detecting vibrator arms 104, 104 are each constituted similarly to either one of the detecting vibrator arms of the first through sixth embodiments described above, and each have substantially the same detection electrodes.

By applying a predetermined alternating-current voltage to the drive electrodes, the driving vibrator arms 103, 103 vibrate flexurally in the X-Y plane the same as the upper and lower surfaces in the directions of coming closer to and getting away from each other. In this state, if the flexural vibrator element 101 rotates around the Y axis, the driving vibrator arms 103, 103 and the detecting vibrator arms 104, 104 vibrate flexurally in the respective directions opposite to each other along the Z-axis direction perpendicular to the upper and lower surfaces due to the action of the Coriolis force. On this occasion, by detecting the voltage signals output from the detection electrodes of the both detecting vibrator arms, the angular velocity of the rotation of the flexural vibrator element 101 can be obtained with high sensitivity.

Figure 10:
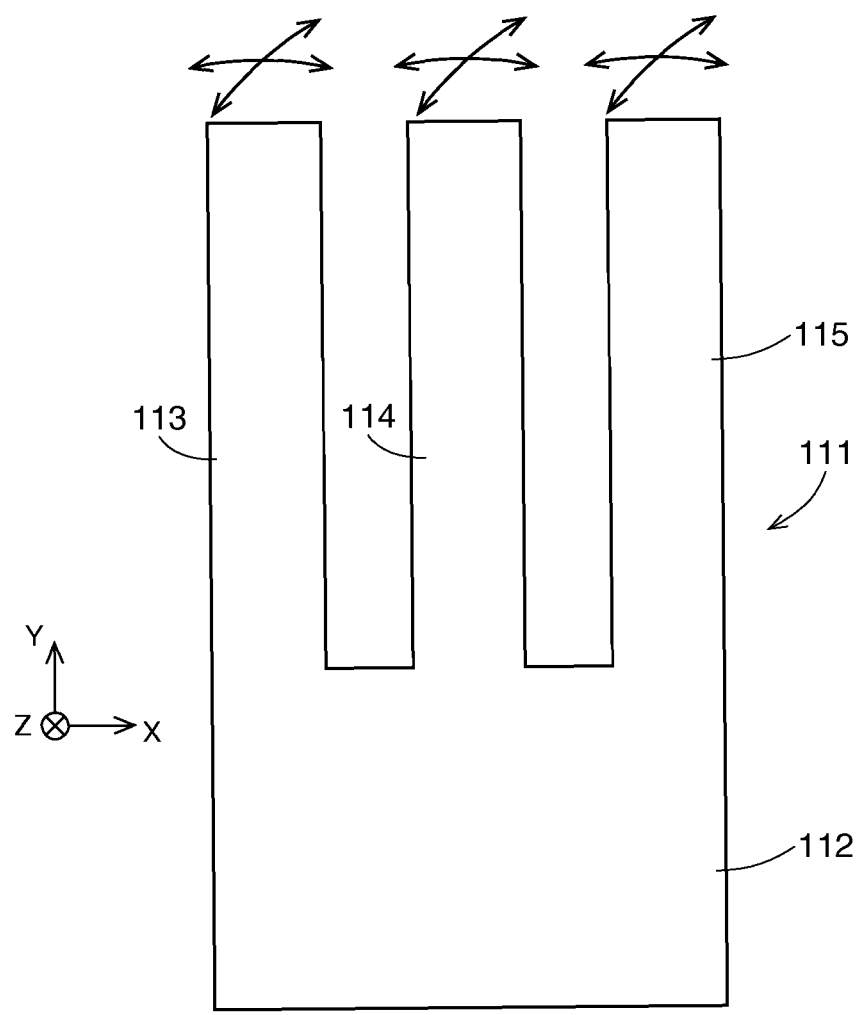
FIG. 10 is a schematic plan view showing a three-legged flexural vibrator element to which the invention is applied.
Figure 11A:
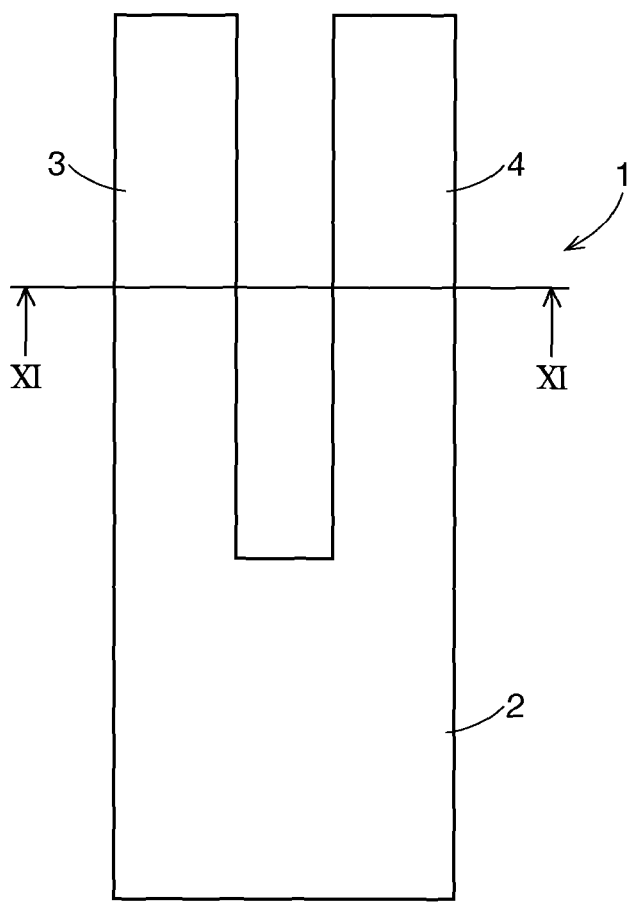
FIG. 11A is a schematic plan view of a tuning-fork flexural vibrator element of the related art.
Figure 11B:
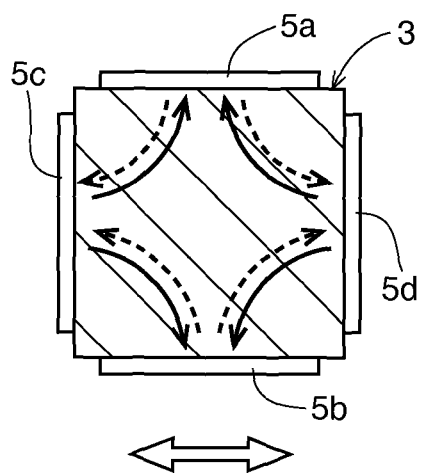
FIG. 11B is a cross-sectional view of a driving vibrator arm in the line XI-XI shown in FIG. 11A.
Figure 11C:
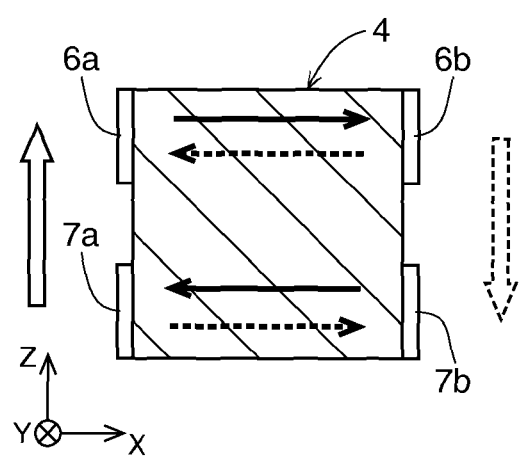
FIG. 11C is a cross-sectional view of a detecting vibrator arm in the same line.
Figure 12A:
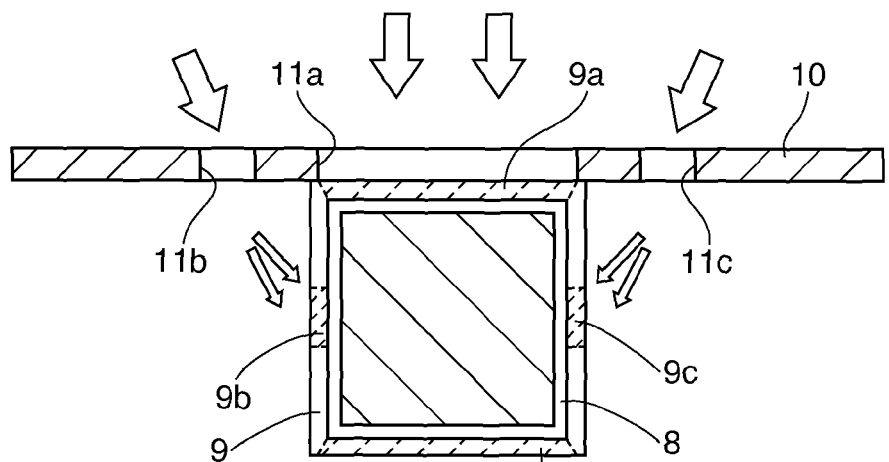
FIGS. 12A through 12D are process diagrams sequentially showing a procedure of patterning detection electrodes on the detecting vibrator arm of the flexural vibrator element of the related art shown in FIGS. 11A though 11C.
Figure 12B:
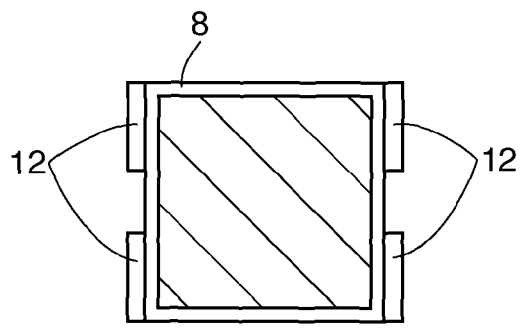
Figure 12C:
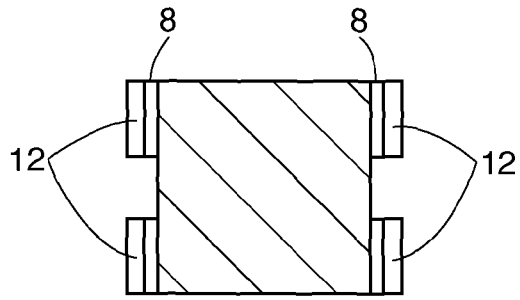
Figure 12D:
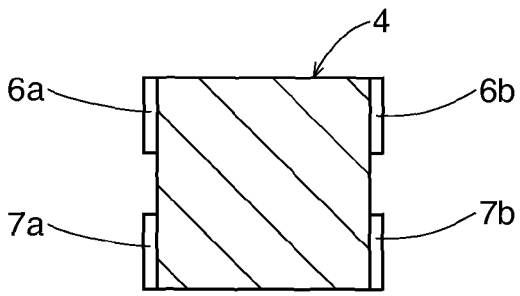

FIG. 10 schematically shows a three-legged flexural vibrator element to which the invention is applied. The three-legged flexural vibrator element 111 is provided with a base section 112 having a rectangular shape, and three vibrator arms 113 through 115 extending from the base section in parallel to each other and each having a polygonal cross-sectional shape having an upper surface, a lower surface, and right and left side surfaces.

In the present embodiment, the vibrator arms 113, 115 at the both ends in the lateral direction correspond to the driving vibrator arms, and are each constituted similarly to the driving vibrator arm 23 of the flexural vibrator element according to the first embodiment, and each have substantially the same drive electrodes. The vibrator arm 114 located at the center corresponds to the detecting vibrator arm, and is constituted similarly to either one of the detecting vibrator arms of the first through sixth embodiments described above, and has substantially the same detection electrodes. In another specific example, it is also possible to set either one of the left and right vibrator arms 113, 115 to the detecting vibrator arm, and set the remaining two vibrator arms to the driving vibrator arms.

By applying a predetermined alternating-current voltage to the drive electrodes, the driving vibrator arms 113, 115 vibrate flexurally in the X-Y plane the same as the upper and lower surfaces in the directions of coming closer to and getting away from each other. In this state, if the flexural vibrator element 111 rotates around the Y axis, all of the vibrator arms 113 through 115 vibrate flexurally in the respective directions opposite to each other along the Z-axis direction perpendicular to the upper and lower surfaces due to the action of the Coriolis force. On this occasion, by detecting the voltage signal output from the detection electrodes of the detecting vibrator arms 114, the angular velocity of the rotation of the flexural vibrator element 111 can be obtained with high sensitivity.

Further, the present embodiment can similarly be applied to a multi-legged flexural vibrator element having four or more vibrator arms.

Further, according to the invention, the cross-sectional shape and the electrode structure of the detecting vibrator arms of each of the embodiments described above can be applied to the driving vibrator arm. In this case, a superior flexural vibrator element with preferable mechanoelectric conversion efficiency, a high Q value, and a low CI value can be obtained.

The invention is not limited to the embodiments described above, but can be put into practice with modifications or changes applied thereto within the scope and the spirits of the invention. For example, the flexural vibrator element according to the invention can also be applied to a sensor element for detecting a physical quantity such as a angular acceleration, an acceleration, or force besides the angular velocity. Further, the flexural vibrator element according to the invention can be made of a piezoelectric single crystal such as lithium tantalate, lithium niobate, a piezoelectric material such as piezoelectric ceramics including, for example, lead zirconate titanate, or a silicon semiconductor material besides quartz crystal. Further, the flexural vibrator element according to the invention can widely be applied to an electronic device such as a digital still camera, a video camera, a navigation system, a vehicle posture detection device, a pointing device, a game controller, a cellular phone, and a head-mount display by mounting the flexural vibrator element as a sensor element.

The entire disclosure of Japanese Patent Application No. 2011-140618, filed Jun. 24, 2011 is expressly incorporated by reference herein.

What is claimed is:

1. A flexural vibrator element comprising:
a base section;
a vibrator arm extending from the base section and having a polygonal cross-sectional shape having an upper surface, a lower surface, and right and left side surfaces; and
a plurality of electrodes respectively provided to the right and left side surfaces of the vibrator arm,
wherein the electrode on at least one side surface of the vibrator arm includes a first electrode and a second electrode separated in a thickness direction of the vibrator arm,
the plurality of electrodes is disposed so that a direction of an electrical field generated between the first electrode and the electrode on the other side surface of the vibrator arm corresponding to the first electrode and a direction of an electrical field generated between the second electrode and the electrode on the other side surface of the vibrator arm corresponding to the second electrode are opposite to each other when the vibrator arm vibrates flexurally along a direction perpendicular to the upper and lower surfaces,
the vibrator arm has a step section formed between the one side surface and one of the upper surface and the lower surface, the step section includes a step surface intersecting with the one side surface and a step side surface intersecting with one of the upper surface and the lower surface, the first electrode and the second electrode are separated by a part of the step surface provided with no electrode film, and formed respectively on the one side surface and the step side surface,
the vibrator arm has a longitudinal groove dug on one of the upper surface and the lower surface, a fifth electrode formed on one inner side surface of the longitudinal groove, and a sixth electrode formed on the other inner side surface of the longitudinal groove, the fifth electrode and the sixth electrode are separated by a part of a bottom surface of the longitudinal groove, the part being provided with no electrode, and
the plurality of electrodes is disposed so that a direction of an electrical field generated between the fifth electrode and the electrode on the left side surface of the vibrator arm corresponding to the fifth electrode is the same as a direction of an electrical field generated between the sixth electrode and the electrode on the right side surface of the vibrator arm corresponding to the sixth electrode, and is opposite to a direction of an electrical field generated between the electrode on the left side surface and the electrode on the right side surface in one of the lower surface side and the upper surface side provided with no longitudinal groove when the vibrator arm vibrates flexurally along a direction perpendicular to the upper and lower surfaces.

2. The flexural vibrator element according to claim 1, wherein
the electrode on the other side surface of the vibrator arm includes a third electrode and a fourth electrode separated in a thickness direction of the vibrator arm,
the plurality of electrodes is disposed so that a direction of an electrical field generated between the first electrode and the third electrode corresponding to the first electrode and a direction of an electrical field generated between the second electrode and the fourth electrode corresponding to the second electrode are opposite to each other when the vibrator arm vibrates flexurally along a direction perpendicular to the upper and lower surfaces, and
the vibrator arm further has a second step section formed between the other side surface and one of the upper surface and the lower surface, the second step section includes a second step surface intersecting with the other side surface and a second step side surface intersecting with one of the upper surface and the lower surface, the third electrode and the fourth electrode are separated by a part of the second step surface provided with no electrode film, and formed respectively on the other side surface and the second step side surface.

3. The flexural vibrator element according to claim 1, wherein
the step section includes a plurality of steps.

4. The flexural vibrator element according to claim 1, wherein
the vibrator arm is a detecting vibrator arm adapted to detect the flexural vibration along the direction perpendicular to the upper and lower surfaces as an electrical signal output from the electrode provided to the vibrator arm, and
the flexural vibrator element further includes a driving vibrator arm extending from the base section along an extension direction of the detecting vibrator arm, and a plurality of drive electrodes disposed on the driving vibrator arm so as to make the driving vibrator arm vibrate flexurally along a direction parallel to the upper and lower surfaces.

5. An electronic device comprising:
the flexural vibrator element according to claim 1.

6. An electronic device comprising:
the flexural vibrator element according to claim 2.

7. An electronic device comprising:
the flexural vibrator element according to claim 3.

8. An electronic device comprising:
the flexural vibrator element according to claim 4.

* * * * *